(12) United States Patent
Cueva et al.

(10) Patent No.: US 11,929,364 B2
(45) Date of Patent: *Mar. 12, 2024

(54) PARASITIC CAPACITANCE REDUCTION IN GaN DEVICES

(71) Applicant: MACOM Technology Solutions Holdings, Inc., Lowell, MA (US)

(72) Inventors: Gabriel R. Cueva, Bedford, NH (US); Timothy E. Boles, Tyngsboro, MA (US); Wayne Mack Struble, Franklin, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 151 days.

This patent is subject to a terminal disclaimer.

(21) Appl. No.: 17/479,543

(22) Filed: Sep. 20, 2021

(65) Prior Publication Data

US 2022/0005764 A1    Jan. 6, 2022

Related U.S. Application Data

(63) Continuation of application No. 16/000,287, filed on Jun. 5, 2018, now Pat. No. 11,158,575.

(51) Int. Cl.
*H01L 27/06* (2006.01)
*H01L 21/02* (2006.01)
(Continued)

(52) U.S. Cl.
CPC ...... *H01L 27/0605* (2013.01); *H01L 21/0254* (2013.01); *H01L 21/743* (2013.01);
(Continued)

(58) Field of Classification Search
CPC .. H01L 27/0605; H01L 29/0649; H01L 23/66
See application file for complete search history.

(56) References Cited

U.S. PATENT DOCUMENTS 4,982,269 A * 1/1991 Calligaro ............ H01L 27/0605
257/626
7,071,498 B2    7/2006 Johnson et al.
(Continued)

FOREIGN PATENT DOCUMENTS

EP    1750298 A2    2/2007
EP    2937995 A1    10/2015
(Continued)

OTHER PUBLICATIONS

Office Action in JP Application No. 2020-568260, dated Feb. 14, 2023.
(Continued)

*Primary Examiner* — Peter M Albrecht
(74) *Attorney, Agent, or Firm* — Perilla Knox & Hildebrandt LLP; Jason M. Perilla

(57) ABSTRACT

Semiconductor structures with reduced parasitic capacitance between interconnects and ground, for example, are described. In one case, a semiconductor structure includes a substrate and a low dielectric constant material region in the substrate. The low dielectric constant material region is positioned between a first device area in the semiconductor structure and a second device area in the semiconductor structure. The semiconductor structure also includes a III-nitride material layer over the substrate. The III-nitride material layer extends over the substrate in the first device area, over the low dielectric constant material region, and over the substrate in the second device area. The semiconductor structure can also include a first device formed in the III-nitride material layer in the first device area, a second device in the III-nitride material layer in the second device area, and an interconnect formed over the low dielectric constant material region. The interconnect can provide a continuous conductive path of metal from the first device
(Continued)

area, over the low dielectric constant material region, and to the second device area.

20 Claims, 6 Drawing Sheets

(51) Int. Cl.
*H01L 21/74* (2006.01)
*H01L 21/76* (2006.01)
*H01L 21/762* (2006.01)
*H01L 21/8252* (2006.01)
*H01L 23/528* (2006.01)
*H01L 23/535* (2006.01)
*H01L 23/66* (2006.01)
*H01L 29/06* (2006.01)
*H01L 29/20* (2006.01)

(52) U.S. Cl.
CPC ........ *H01L 21/746* (2013.01); *H01L 21/7605* (2013.01); *H01L 21/76202* (2013.01); *H01L 21/8252* (2013.01); *H01L 23/5286* (2013.01); *H01L 23/535* (2013.01); *H01L 23/66* (2013.01); *H01L 29/0649* (2013.01); *H01L 29/2003* (2013.01)

(56) References Cited

U.S. PATENT DOCUMENTS

| | | | |
|---|---|---|---|
| 7,135,720 B2 | 11/2006 | Nagy et al. | |
| 7,247,889 B2 | 7/2007 | Hanson et al. | |
| 8,310,305 B1 | 11/2012 | Cripe et al. | |
| 9,064,775 B2 | 6/2015 | Weeks, Jr. et al. | |
| 9,722,032 B2 | 8/2017 | Nagy et al. | |
| 9,806,159 B2 | 10/2017 | Nagy et al. | |
| 9,935,581 B2 | 4/2018 | Takagi | |
| 10,204,992 B2 | 2/2019 | Nagy et al. | |
| 10,665,577 B2 | 5/2020 | Then et al. | |
| 11,158,575 B2* | 10/2021 | Cueva | H01L 27/0605 |
| 2003/0015707 A1 | 1/2003 | Bosco et al. | |
| 2003/0030504 A1 | 2/2003 | Dixit et al. | |
| 2007/0024371 A1 | 2/2007 | Gotou et al. | |
| 2008/0315392 A1 | 12/2008 | Farrell et al. | |
| 2009/0237166 A1 | 9/2009 | Gotou et al. | |
| 2011/0148529 A1 | 6/2011 | Besling et al. | |
| 2011/0221519 A1 | 9/2011 | Katoh et al. | |
| 2011/0298535 A1 | 12/2011 | Van Rijs et al. | |
| 2013/0106519 A1 | 5/2013 | Kamiyama et al. | |
| 2014/0051226 A1 | 2/2014 | Bahl et al. | |
| 2014/0264361 A1 | 9/2014 | Chu et al. | |
| 2014/0354356 A1 | 12/2014 | Beltran Lizarraga | |
| 2015/0214917 A1 | 7/2015 | Ho et al. | |
| 2015/0280685 A1 | 10/2015 | Goumas et al. | |
| 2016/0086878 A1 | 3/2016 | Otremba et al. | |
| 2016/0343809 A1 | 11/2016 | Green et al. | |
| 2017/0011919 A1 | 1/2017 | Omori et al. | |
| 2017/0104073 A1 | 4/2017 | Nagy et al. | |
| 2017/0104075 A1 | 4/2017 | Nagy et al. | |
| 2017/0302245 A1 | 10/2017 | Sadler et al. | |
| 2018/0033682 A1* | 2/2018 | Chern | H01L 27/0605 |
| 2018/0083105 A1 | 3/2018 | Nagy et al. | |
| 2018/0350944 A1 | 12/2018 | Huang | |
| 2019/0006171 A1 | 1/2019 | Dasgupta et al. | |
| 2020/0144393 A1* | 5/2020 | Kitano | H01L 29/66462 |

FOREIGN PATENT DOCUMENTS

| | | |
|---|---|---|
| JP | 2012054559 A | 3/2012 |
| JP | 2012164900 A | 8/2012 |
| JP | 2014072360 A | 4/2014 |
| JP | 2015060893 A | 3/2015 |
| JP | 2015065233 A | 4/2015 |
| WO | 0203420 A2 | 1/2002 |

OTHER PUBLICATIONS

"Spin-on glass" in Semiconductor Glossary by Jerzy Ruzyllo. Copyright 2001-2016. Accessed Aug. 17, 2019. (Year: 2016).
Extended European Search Report for European Application No. EP 16190615 .1, dated Mar. 8, 2017.
International Search Report and Written Opinion for International Application No. PCT/US2017/021746, dated Jun. 23, 2017 (MI374.70003WO00).
International Search Report and Written Opinion for International Application No. PCT/US2019/035575, dated Sep. 23, 2019 (MI374.70064WO00).
[No Author Listed], Gallium Nitride 48V, IOOW, DC-2.2 GHz HEMT: Built Using the SIGANTIC Process—A proprietary GaN-on-Silicon teclmology. Nitronex. NPT2010. 2013. Accessed Feb. 23, 2017. 1-10.
[No Author Listed], GaN Wideband Transistor 48 V, 50 W DC-3.5 GHZ. Macom Teclmology Solutions Inc. NPT2020. Accessed Feb. 23, 2017. Available at: https://cdn.macom.com/datasheets/NPT2020.pdf. 13 pages.
Caspers, RF engineering basic concepts: the Smith chart. CERN Yellow Report. Jan. 2012: 1-22.
Jantarachote et al., Frequency band and operating class reconfigurable GaN HEMT power amplifier for sustainable wireless communications and energy applications. The 20th Asia-Pacific Conference on Communication (APCC). 2014:156-60.
Shor, Broadbanding techniques for TEM N-way power dividers. IEEE International Microwave Symposium. 1988:657-9.
Victor et al., Voltage controlled GaN-on-Si HFET power oscillator using thin-film ferroelectric varactor tuning. Proceedings of the 36th European Microwave Conference. Sep. 2006;87-90.

* cited by examiner

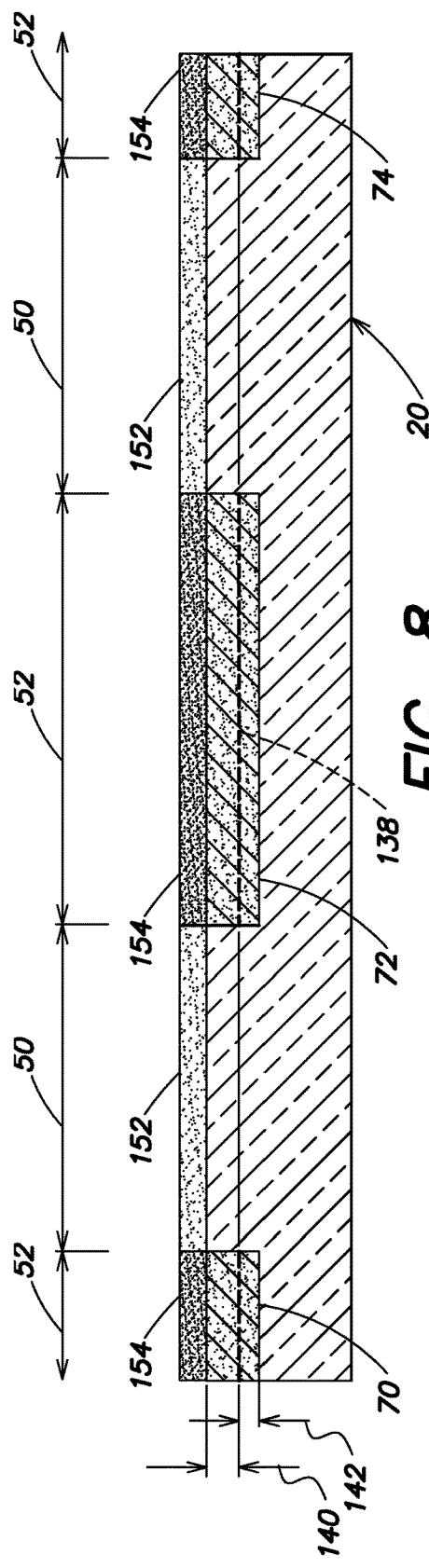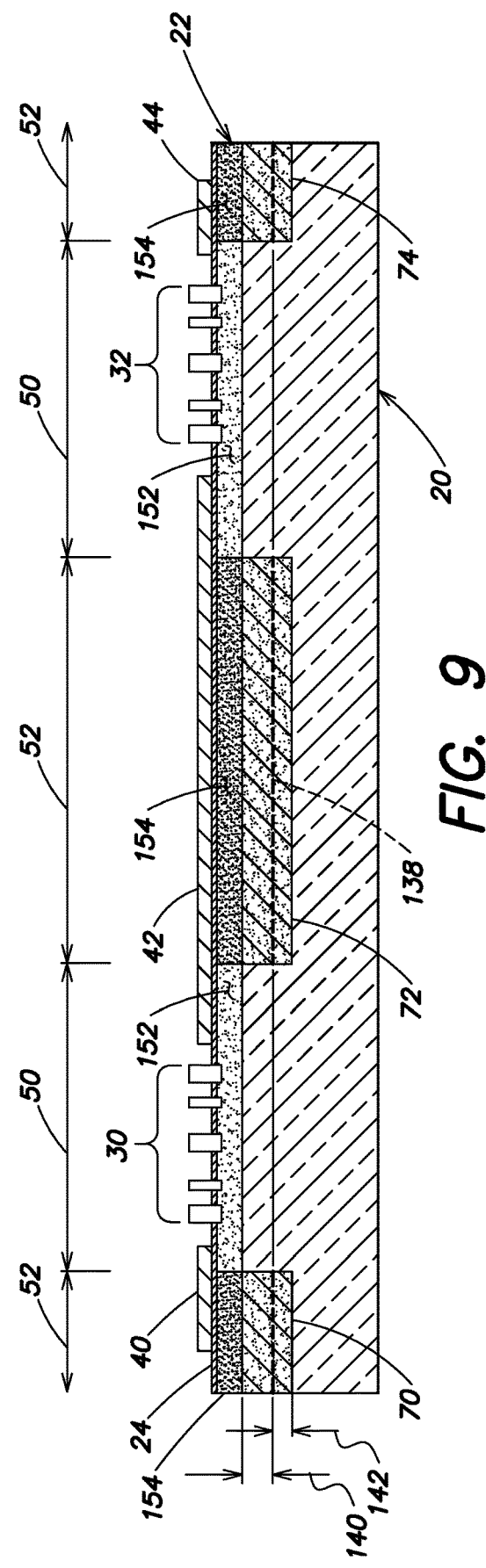

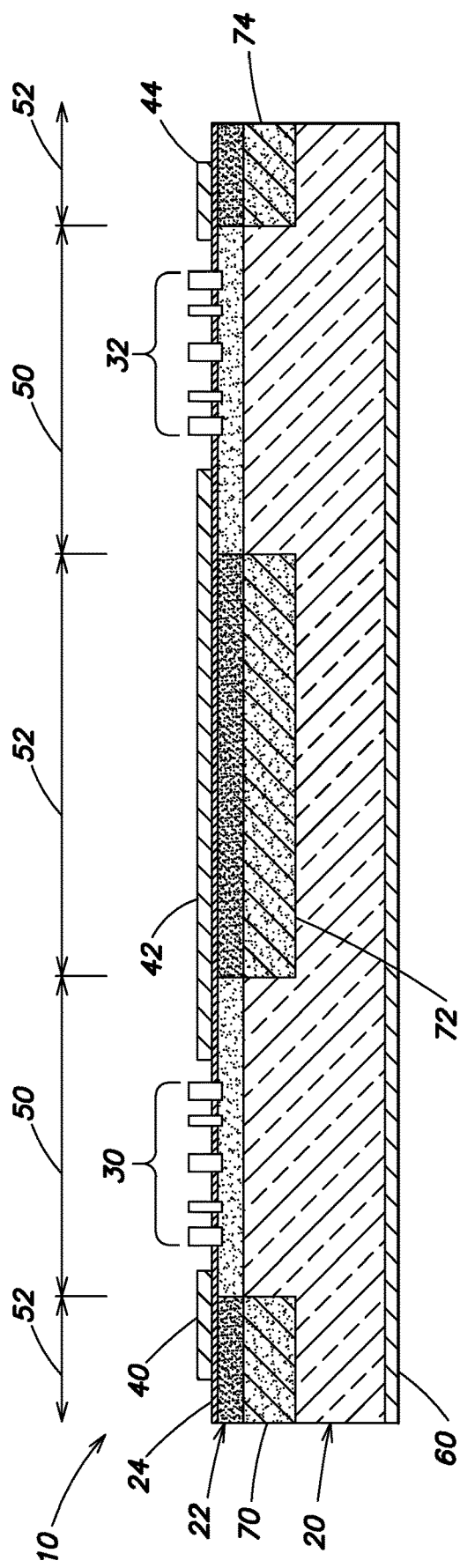

PARASITIC CAPACITANCE REDUCTION IN GaN DEVICES

CROSS-REFERENCE TO RELATED APPLICATIONS

This application is a continuation of U.S. patent application Ser. No. 16/000,287, titled "PARASITIC CAPACITANCE REDUCTION IN GAN-ON-SILICON DEVICES," filed Jun. 5, 2018, the entire contents of which is hereby incorporated herein by reference.

TECHNICAL FIELD

The disclosed technology relates to gallium nitride (GaN)-on-silicon semiconductor devices and, more particularly, to reduction of parasitic capacitance in GaN-on-silicon semiconductor devices.

BACKGROUND

Gallium nitride transistors are used for high frequency power amplifiers because they can operate at high temperatures and high voltage. Such devices may be used, for example, in microwave ovens, medical applications such as magnetic resonance imaging, base stations of mobile phone systems and radio communications.

Gallium nitride transistors may be fabricated on silicon substrates. GaN-on-silicon devices may include a silicon substrate and a GaN layer formed on the silicon substrate. One or more gallium nitride transistors and one or more interconnects are formed on a top surface of the GaN layer. The interconnects may include interconnect lines and bond pads. The bottom surface of the silicon substrate may be metallized to provide a ground plane.

While gallium nitride transistors exhibit excellent performance, there is a need for improved semiconductor structures and methods of fabrication.

SUMMARY

The inventors have discovered that the RF performance of GaN-on-silicon structures is limited, in part, by the parasitic capacitance between the interconnects on the front side of the substrate and ground, such as a ground plane on the back side of the substrate. Such parasitic capacitance can degrade the performance of the devices at high frequencies. Accordingly, there is a need for semiconductor structures and methods in which the effect of parasitic capacitance between interconnects on the front side of the substrate and ground is at least partially overcome.

The disclosed technology provides semiconductor structures and methods for making semiconductor structures, wherein at least a portion of the substrate between the interconnects and ground is replaced with a material that has a dielectric constant lower than the dielectric constant of the substrate. As a result, the capacitance between the front side interconnects and ground is reduced in comparison with a structure in which all or most of the space between the front side interconnects and ground is the substrate material.

In some embodiments, the substrate may be silicon and the low dielectric constant material may be silicon dioxide. The silicon dioxide may be formed using a LOCOS (Local Oxidation of Silicon) process. Since the capacitance between the front side interconnects and ground is a function of the dielectric constant of the material between the front side interconnects and ground, a reduction in dielectric constant reduces the parasitic capacitance.

In accordance with embodiments, a method for making a semiconductor structure comprises defining one or more device areas and one or more interconnect areas on a silicon substrate, forming trenches in the interconnect areas of the silicon substrate, oxidizing the silicon substrate in the trenches to form silicon dioxide regions, forming a III-nitride material layer on the surface of the silicon substrate, forming devices in the device areas of the gallium nitride layer, and forming interconnects in the interconnect areas.

In some embodiments, defining one or more interconnect areas comprises forming a mask layer on the silicon substrate and patterning the mask layer by removing the mask layer in the one or more interconnect areas.

In some embodiments, the method further comprises stripping the patterned mask layer from the silicon substrate after oxidizing the silicon substrate in the trenches.

In some embodiments, the mask layer includes silicon nitride.

In some embodiments, the mask layer is formed by low pressure chemical vapor deposition.

In some embodiments, the trenches are formed by etching.

In some embodiments, oxidizing the silicon substrate is performed by a LOCOS (Local Oxidation of Silicon) process.

In some embodiments, the top surfaces of the silicon dioxide regions are coplanar with a top surface of the silicon substrate.

In some embodiments, the method further comprises planarizing the surface of the substrate and the silicon dioxide regions before forming the III-nitride material layer.

In some embodiments, forming the III-nitride material layer comprises epitaxial growth of a gallium nitride layer.

In some embodiments, forming devices comprises forming gallium nitride devices.

In some embodiments, forming interconnects includes forming interconnect lines and/or bond pads.

In some embodiments, the method further comprises removing the III-nitride material layer in the interconnect areas before forming the interconnects.

In some embodiments, the method further comprises forming a metal layer on a back surface of the silicon substrate.

In some embodiments, the method further comprises thinning the silicon substrate before forming the metal layer.

In accordance with embodiments, a semiconductor structure comprises a silicon substrate having one or more device areas and one or more interconnect areas, a III-nitride material layer on a front side of the silicon substrate at least in the device areas, one or more devices in the device areas, one or more interconnects in the interconnect areas, and silicon dioxide regions in the interconnect areas of the substrate between the interconnects and the metal layer on the back side of the substrate.

In some embodiments, the top surfaces of the silicon dioxide regions are coplanar with a top surface of the silicon substrate.

In some embodiments, the III-nitride material layer comprises single crystal gallium nitride in the device areas.

In some embodiments, the devices comprise gallium nitride devices.

In some embodiments, the interconnects comprise interconnect lines and/or bond pads.

In some embodiments, the semiconductor structure further comprises a metal layer on a back side of the silicon substrate.

In accordance with embodiments, a method for making a semiconductor structure comprises defining one or more device areas and one or more interconnect areas on a substrate, forming trenches in the interconnect areas of the substrate, and forming in the trenches a material having a dielectric constant lower than the dielectric constant of the substrate.

In some embodiments, the method further comprises forming a metal layer on a back surface of the substrate.

In some embodiments, the method further comprises forming a III-nitride material layer on a front surface of the substrate.

In some embodiments, the low dielectric constant material comprises silicon dioxide.

In some embodiments, the substrate comprises a silicon substrate and forming the low dielectric constant material comprises thermal oxidation of the silicon substrate to form silicon dioxide.

In some embodiments, the method further comprises forming devices in the device areas and forming interconnects in the interconnect areas.

In accordance with embodiments, a semiconductor structure comprises a substrate having one or more device areas and one or more interconnect areas; a III-nitride material layer on a front side of the substrate at least in the device areas; and material in the interconnect areas of the substrate having a dielectric constant lower than the dielectric constant of the substrate.

BRIEF DESCRIPTION OF DRAWINGS

The disclosed technology may be understood with reference to the accompanying drawings, which are incorporated herein by reference and in which:

FIGS. 2-10 illustrate a process for making a semiconductor structure, in accordance with embodiments.

DETAILED DESCRIPTION

Figure 1:
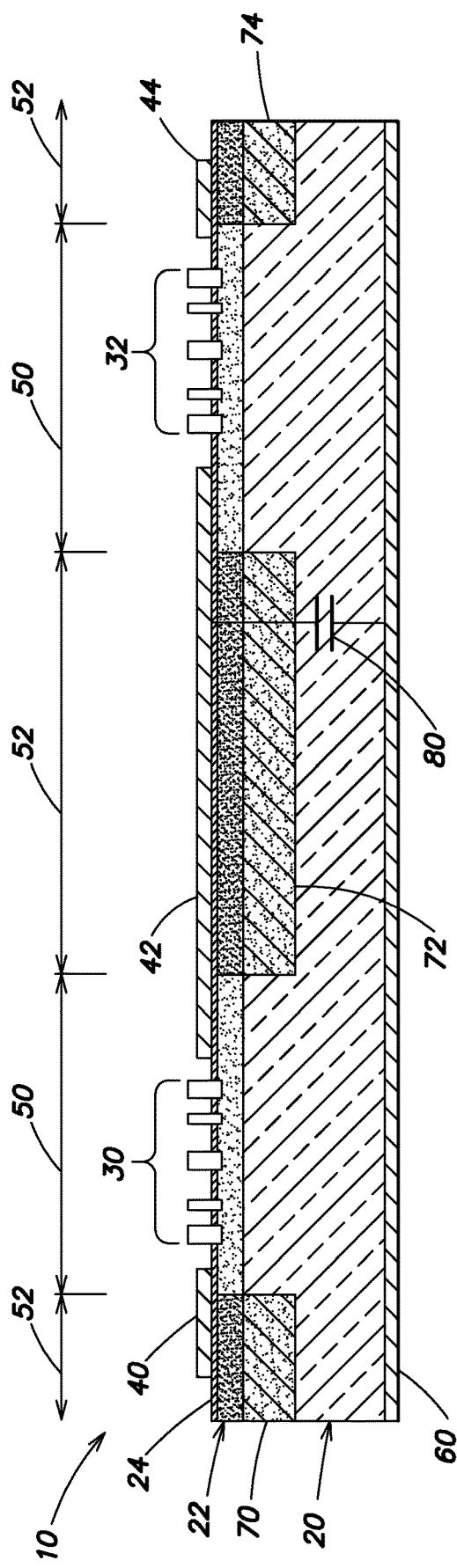
FIG. 1 is a simplified schematic cross-sectional diagram of a semiconductor structure in accordance with embodiments.

A simplified schematic cross-sectional view of a semiconductor structure 10 in accordance with embodiments is shown in FIG. 1. The semiconductor structure 10 includes a substrate, such as a silicon substrate 20, a III-nitride material layer such as a gallium nitride layer 22, a passivation/encapsulation layer 24, one or more devices 30 and 32 (shown schematically in FIG. 1) and one or more interconnects 40, 42 and 44. The devices 30 and 32 are located in one or more device areas 50 of the silicon substrate 20, and the interconnects 40, 42 and 44 are located in one or more interconnect areas 52 of the silicon substrate 20. The devices 30 and 32 may include, for example, gallium nitride transistors, and the interconnects 40, 42 and 44 may include, for example, one or more metal interconnect lines and/or one or more metal bond pads. The interconnects may interconnect the devices on the substrate and/or may provide external connections. A metal layer 60 may be formed on the back side of silicon substrate 20 and may serve as a ground plane.

As further shown in FIG. 1, the semiconductor structure 10 includes low dielectric constant material regions 70, 72 and 74 formed in silicon substrate 20. In low dielectric constant material regions 70, 72 and 74, the silicon of silicon substrate 20 is replaced with a material that has a dielectric constant that is lower than the dielectric constant of the silicon substrate. In the embodiment of FIG. 1, the low dielectric constant material is silicon dioxide and the regions 70, 72 and 74 will be referred to as silicon dioxide regions 70, 72 and 74. Silicon has a dielectric constant of 11.65, and silicon dioxide has a dielectric constant of 3.9.

The silicon dioxide regions 70, 72 and 74 underlie the interconnects 40, 42 and 44, respectively. As a result, the silicon dioxide regions 70, 72 and 74 are located between the respective interconnects and the metal layer 60 on the back side of silicon substrate 20.

Parasitic Capacitance

A parasitic capacitance between interconnect 42 and metal layer 60 is represented as a parasitic capacitor 80 in FIG. 1. Interconnect 42 forms a first plate of the parasitic capacitor, metal layer 60 forms a second plate of the parasitic capacitor and the layers of the structure between interconnect 42 and metal layer 60 form the dielectric of the parasitic capacitor. Parasitic capacitors are also formed between each of interconnects 40 and 44 and metal layer 60. The parasitic capacitors degrade the performance of the semiconductor structure. It will be understood that the parasitic capacitance is a distributed effect over the areas of interconnects 40, 42, 44 and metal layer 60. As is known, the capacitance of a parallel plate capacitor is proportional to the dielectric constant of the dielectric material between the parallel plates. Thus, the parasitic capacitance can be reduced by providing a dielectric material between the plates of the capacitor that has a dielectric constant lower than the dielectric constant of silicon.

In some embodiments, the semiconductor structure does not include a metal layer on the back surface of the substrate. However, in such embodiments, the semiconductor structure may be grounded in use, and a parasitic capacitance exists between the interconnects and ground regardless of whether the semiconductor structure includes a metal layer on its back surface.

Referring to FIG. 1, the region between interconnect 42 and metal layer 60 is filled in part by silicon dioxide region 72. By providing the silicon dioxide region 72 between interconnect 42 and metal layer 60, the dielectric constant of the dielectric material of the parasitic capacitor is reduced in comparison with silicon as the dielectric material, thereby reducing the parasitic capacitance. In other embodiments, the low dielectric constant material may be a material which has a low dielectric constant and which can survive the epitaxial growth temperature of the subsequently-formed III-nitride material.

The silicon dioxide regions 70, 72 and 74 may underlie some or all of the interconnects on the semiconductor structure 10. Further, each of the silicon dioxide regions 70, 72 and 74 should underlie as much of the respective interconnects as is practical in order to achieve the greatest reduction in parasitic capacitance.

Substrate

As described above, the substrate may comprise silicon (i.e., a substrate containing the element silicon in any form). Some embodiments are related to substrates at least a portion of which is made of silicon. Certain embodiments are related to substrates at least a portion of which (or all of which) is made of bulk silicon. As used herein, bulk silicon refers to doped or undoped elemental Si in any form. Substrates that contain bulk silicon can include, for example, at least a layer of doped or undoped silicon, as opposed to silicon oxides, silicon carbides, silicon nitrides, etc. Examples of substrates comprising silicon that can be used in various embodiments include, but are not limited to, bulk silicon wafers, silicon-on-insulator substrates, and substrates made of alloys of silicon (e.g., silicon germanium and silicon carbide substrates). In some embodiments, the substrate comprises a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, and silicon-on-sapphire (SOS) substrates. Suitable silicon substrates also include composite substrates that have a silicon wafer bonded to another material such as diamond or other crystallographic forms of carbon, aluminum nitride (AlN), silicon carbide (SiC), or other crystalline or polycrystalline materials. Silicon substrates having different crystallographic orientations may be used, though single crystal silicon substrates may be preferred in certain, but not necessarily all, embodiments. In some embodiments, silicon (111) substrates are used. In certain embodiments, silicon (100) or (110) substrates are used. As used herein, a silicon carbide substrate refers to any substrate that includes a silicon carbide surface. Examples of suitable silicon carbide substrates include substrates that are composed entirely of silicon carbide (e.g., bulk silicon carbide wafers), silicon carbide composite wafers (e.g., wafers comprising a silicon carbide layer and a second layer of a material that is not silicon carbide), and the like.

In some embodiments, the substrate may have any of a variety of suitable thicknesses. According to some embodiments, the substrate has a final thickness after processing and any wafer thinning of less than 150 micrometers. According to certain embodiments, the substrate has a final thickness of less than 100 micrometers, less than 50 micrometers, or less. According to certain embodiments, the final thickness of the substrate may be selected based on the final device and heteroepitaxial specifications (e.g., wafer warp and bow), for example, as needed for successful high yielding semiconductor fabrication. In some embodiments, the thickness of the substrate may be semi-spec thicknesses typical of the wafer diameter used in high volume wafer silicon manufacturing.

III-Nitride Material

As used herein, the term "III-nitride material" refers to any Group III element-nitride compound. Non-limiting examples of III-nitride materials include boron nitride (BN), aluminum nitride (AlN), gallium nitride (GaN), indium nitride (InN), and thallium nitride (TlN), as well as any alloys including Group III elements and Group V elements (e.g., $Al_xGa_{(1-x)}N$, $Al_xIn_yGa_{(1-x-y)}N$, $In_yGa_{(1-y)}N$, $Al_xIn_{(1-x)}N$, $GaAs_aP_bN_{(1-a-b)}$, $Al_xIn_yGa_{(1-x-y)}As_aP_bN_{(1-a-b)}$, and the like). Typically, when present, arsenic and/or phosphorus are at low concentrations (e.g., less than 5 weight percent). III-nitride materials may be doped n-type or p-type, or may be intrinsic. III-nitride materials may have any polarity including but not limited to Ga-polar, N-polar, semi-polar, or non-polar crystal orientations. A III-nitride material may also include either the Wurtzite, Zincblende, or mixed polytypes, and may include monocrystalline, polycrystalline, or amorphous structures.

In some embodiments, the III-nitride material region comprises a gallium nitride material. As used herein, the phrase "gallium nitride material" refers to gallium nitride (GaN) and any of its alloys, such as aluminum gallium nitride ($Al_xG_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_aP_bN_{(1-a-b)}$), aluminum indium gallium arsenide phosphoride nitride ($Al_xIn_yGa_{(1-x-y)}As_aP_bN_{(1-a-b)}$), amongst others. In certain embodiments, the III-nitride material region comprises GaN. According to some embodiments, the III-nitride material region is an epitaxial III-nitride material region. In certain embodiments, the III-nitride material region comprises a heterojunction, a two-dimensional electron gas (2DEG) region, or two-dimensional hole gas (2DHG). In some embodiments, the III-Nitride material region comprises doped homojunctions and/or doped heterojunctions.

Process

A process for making a semiconductor structure in accordance with embodiments is described with reference to FIGS. 2-10, which illustrate steps of the process. It will be understood that one or more steps described herein may be omitted and that additional steps may be included in the overall process. In some embodiments, the steps of the process may be performed in a different order from the order described herein.

Figure 2:
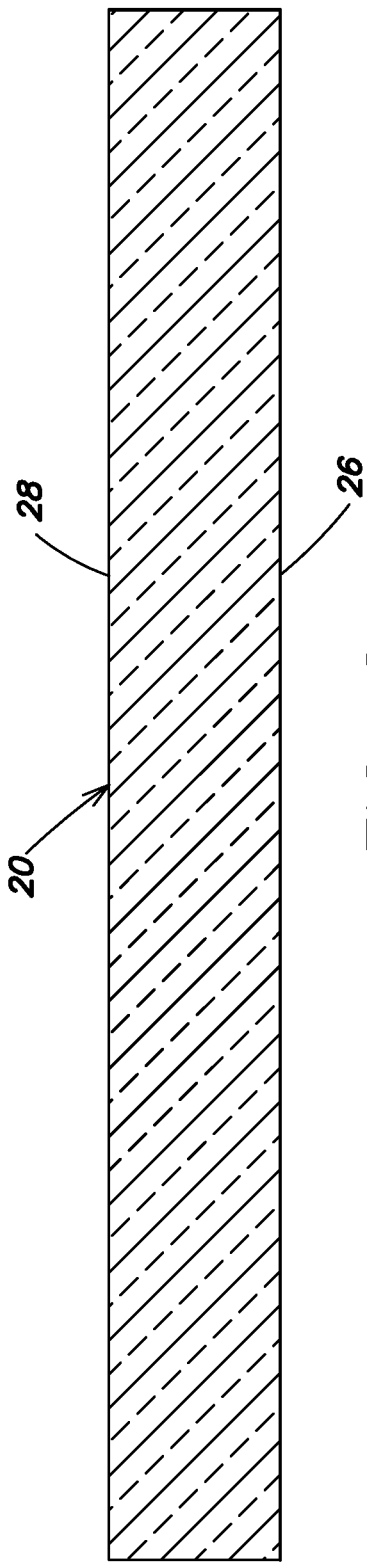

Referring to FIG. 2, the process begins with silicon substrate 20. The silicon substrate 20 may be p-type or n-type and may have any suitable conductivity. The silicon substrate 20 may have a thickness in a range of 500 um to 1000 um, but this is not a limitation. In one example, the silicon substrate may be 625 um, 100 mm diameter, 0.02 ohm-cm Boron doped silicon. The silicon substrate 20 is referred to as having a front side 28 and a back side 26. Other examples of the substrate include, without limitation, 675 um, 150 mm diameter, 0.02 ohm-cm silicon; 725 um, 200 mm diameter, 0.02 ohm-cm silicon; and 775 um, 300 mm diameter, 0.02 ohm-cm silicon.

Figure 3:
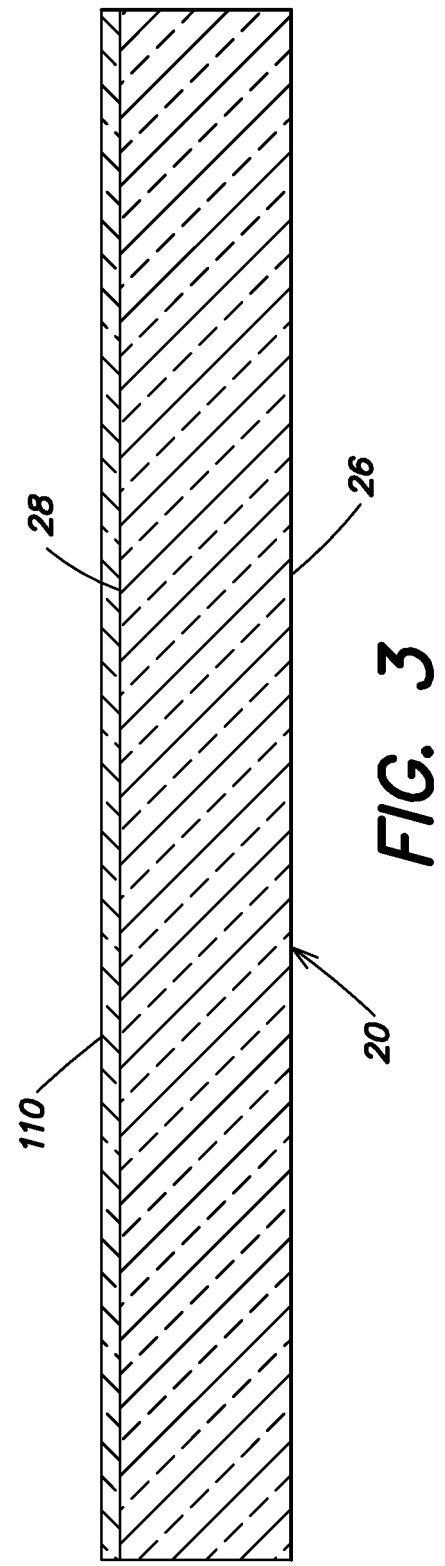

Referring to FIG. 3, a masking layer such as a silicon nitride masking layer 110 is formed on the top surface of the silicon substrate 20. The silicon nitride masking layer 110 may be formed by Low Pressure Chemical Vapor Deposition (LPCVD) and may have a thickness of 2000 Å to 4000 Å, although this is not a limitation. Other suitable masking layers include plasma enhanced (PECVD) silicon nitride (>550 C deposition temperature/zero trapped hydrogen), sputtered silicon nitride, atomic layer deposition (ALD) of silicon nitride, or a layered combination of these films with or without an added LPCVD silicon nitride layer. Any non-oxidizing material that is adherent to the silicon substrate, that can be patterned by standard photolithographic processes, and that can survive silicon oxidation temperatures can be employed.

Figure 4:
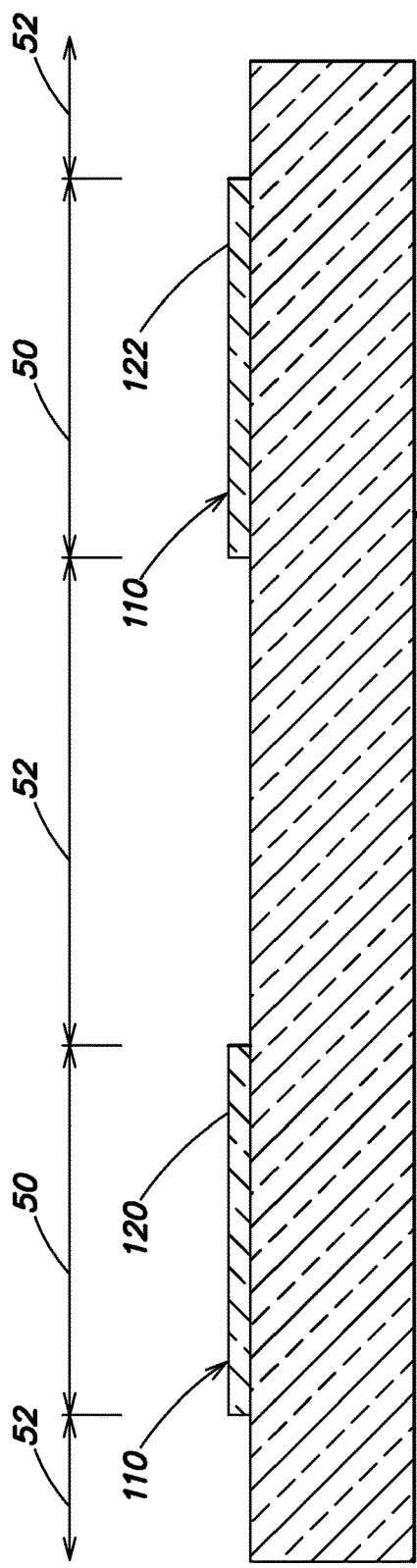

Referring to FIG. 4, the silicon nitride masking layer 110 is patterned using conventional patterning techniques. For example, a mask defining areas of the silicon nitride layer 110 to be removed is placed over silicon nitride layer 110, and an etching step is performed. The patterning mask is formed by typical photolithographic processes employing light sensitive organic polymers (photoresist) that are temporarily applied to the surface of the silicon nitride masking layer. The photoresist pattern is transferred to the silicon nitride masking layer via standard dry etch plasma, RIE (reactive ion etch), or ICP (inductively coupled plasma) techniques. The temporary patterning photoresist is then removed via dry or wet chemical processes.

After patterning, the silicon nitride layer 110 remains in device areas 50 and is removed in interconnect areas 52 to expose the silicon substrate 20. It will be understood that the device areas 50 do not necessarily match areas occupied by the devices and that the interconnect areas 52 do not necessarily match areas occupied by the interconnects. Instead, the interconnect areas 52 define areas where the silicon substrate 20 is at least partially replaced with a low dielectric constant material, and the device areas 50 define areas where the silicon substrate 20 is not replaced with a low dielectric constant material. The interconnects may extend from the interconnect areas into the device areas in order to connect to the devices.

Figure 5:
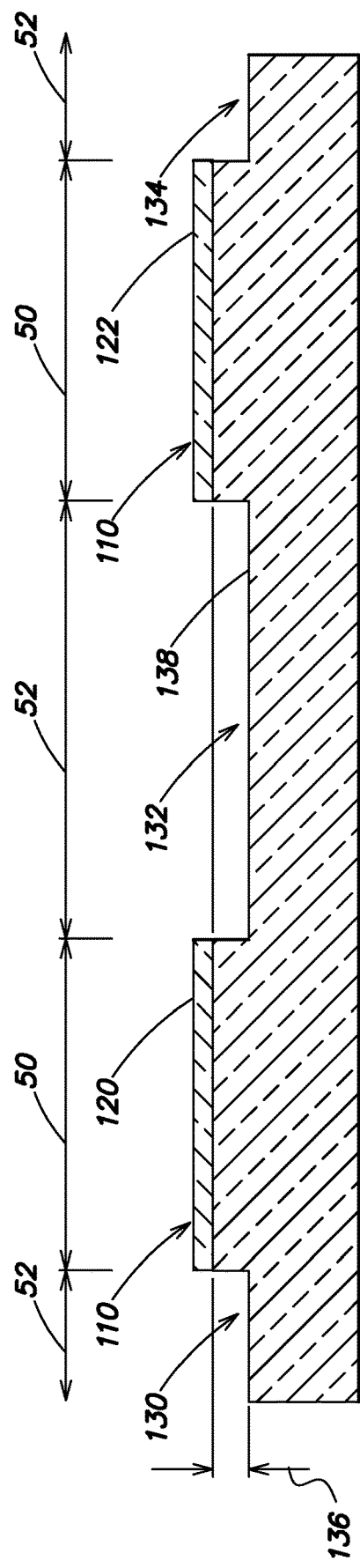

Referring to FIG. 5, an etching step is performed on the substrate 20 partially covered by the patterned silicon nitride layer 110. The etching process removes portions of the silicon substrate that are not covered by silicon nitride layer 110. In particular, the etching process removes the silicon of the substrate 20 in the interconnect areas 52 to form trenches 130, 132 and 134. The trenches 130, 132 and 134 are formed to have a controlled depth 136 based on a desired thickness of a subsequently formed oxide region. The depth 136 of trenches 130, 132 and 134 may be defined as the depth from the top surface of the silicon substrate 20 in device areas 50 to a surface 138 of the silicon substrate 20 in trenches 130, 132 and 134 after trench formation and prior to oxidation. The depth of the trenches depends on the thickness of the substrate 20 in the final structure and may be 0.5% to 10% of the substrate thickness. In one example, the depth 136 of trenches 130, 132 and 134 may be about 5 microns in order to form an oxide region having a depth of about 10 microns. It will be understood that this example is not limiting. Device areas 50 under portions 120 and 122 of silicon nitride layer 110 are not affected by the etching process.

Figure 6:
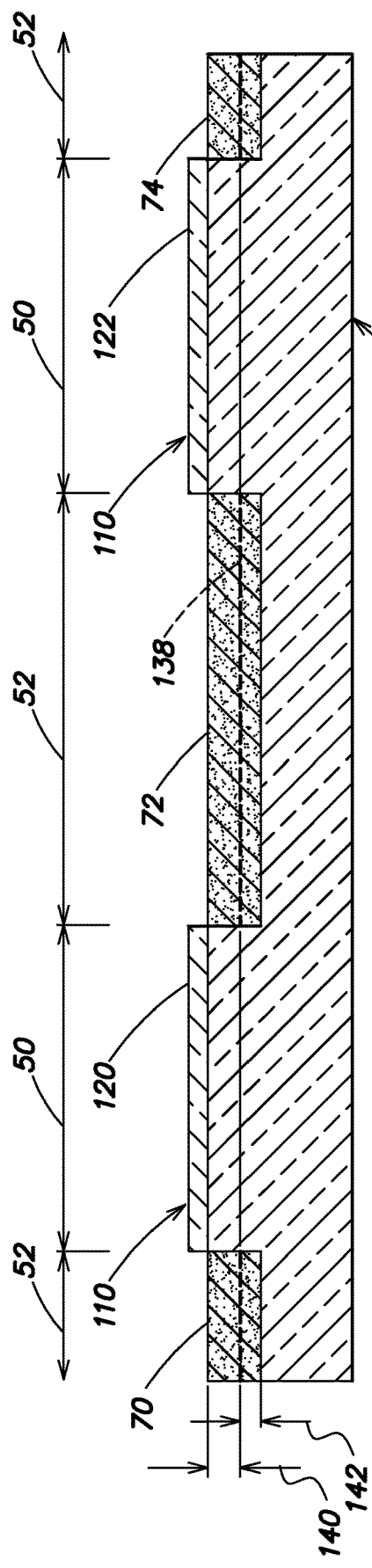

Referring to FIG. 6, a thermal oxidation step is performed on the substrate 20 masked by portions 120 and 122 of silicon nitride layer 110. The thermal oxidation step causes the silicon substrate 20 to be oxidized in the trenches 130, 132 and 134, while the device areas 50 masked by portions 120 and 122 of silicon nitride layer 110 are not affected. In particular, the silicon in trenches 130, 132 and 134 is oxidized to form silicon dioxide. The thermal oxidation step is continued until the silicon dioxide fills the trenches 130, 132 and 134 to form silicon dioxide regions 70, 72 and 74, respectively. The thermal oxidation step is performed until the top surfaces of the silicon dioxide regions 70, 72 and 74 are substantially coplanar with the top surface of the silicon substrate 20 in device areas 50. The thermal oxidation step may be part of a LOCOS process.

After thermal oxidation of silicon, the silicon dioxide region extends above and below the trench surface 138 after trench formation and prior to oxidation. In particular, approximately 54% of the silicon dioxide thickness, shown as thickness 140, is above the trench surface 138 prior to oxidation, and approximately 46% of the silicon dioxide thickness, shown as thickness 142, is below the trench surface 138 prior to oxidation. By appropriate choice of trench depth and thermal oxidation parameters, silicon dioxide regions 70, 72 and 74 may be formed that are nearly twice the depth of the trenches and which are coplanar b nearly coplanar with the top surface of the silicon substrate 20 in the device areas 50.

For atmospheric pressures, typical oxidation temperatures range from 1000 degrees centigrade to 1200 degrees centigrade. The oxidizing species is formed by combining hydrogen and oxygen to produce a saturated steam environment. Time is used as a variable parameter to grow the desired silicon dioxide thickness. Use of HiPDX (High Pressure Oxidation) systems can reduce both the temperature and time required to produce the desired silicon dioxide thickness. In this HiPDX process hydrogen and oxygen are again combined to produce steam but at significantly increased pressures, ranging typically from 10 times to 25 times atmosphere.

Figure 7:
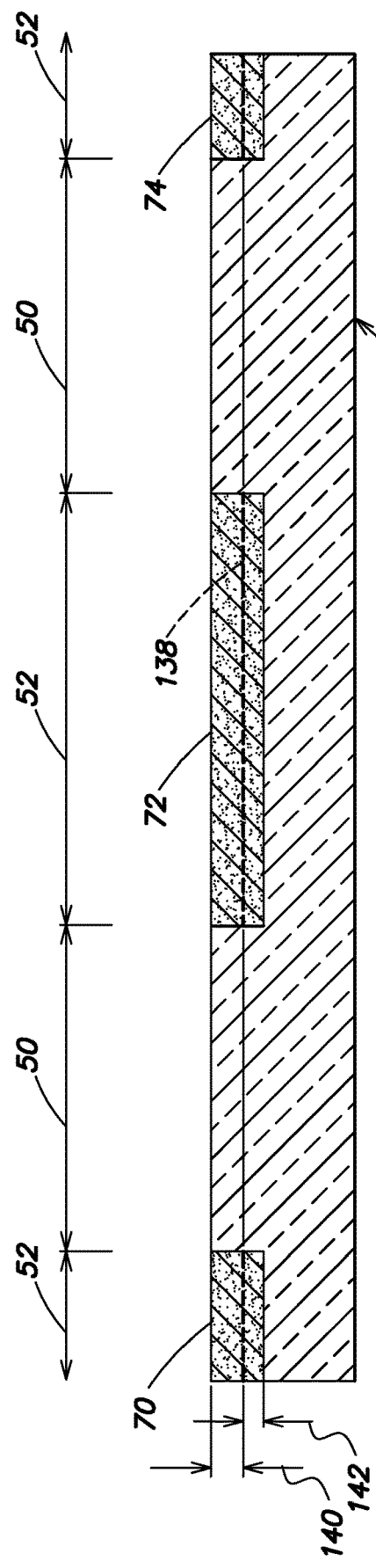

Referring to FIG. 7, the silicon nitride layer 110 is stripped from the surface of silicon substrate 20 by etching. The silicon nitride masking layer is removed via phosphoric acid at elevated temperatures typically in the range between 120 degrees centigrade and 200 degrees centigrade. Alternately, the silicon nitride film may be removed by chemical mechanical polishing to the silicon surface. After removal of the silicon nitride layer 110, the surface of silicon substrate 20 is exposed in device areas 50 and the silicon dioxide is exposed in interconnect areas 52. Preferably, planarity of the surface is maintained across the boundaries between the silicon in device areas 50 and the silicon dioxide in interconnect areas 52. In some embodiments, the surface of the silicon substrate may be polished to ensure a flat surface.

Referring to FIG. 8, an epitaxial growth step is performed. In particular, the gallium nitride layer 22 or other III-nitride material layer is formed on the top surface of silicon substrate 20 by epitaxial growth. The gallium nitride layer 22 may have a thickness in the range of 0.8 um to 6 um, but this is not a limitation. As shown in FIG. 8, the gallium nitride layer 22 may include single crystal gallium nitride 152 in device areas 50 and may include polycrystalline gallium nitride 154 in interconnect areas 52. The single crystal gallium nitride 152 forms on the silicon substrate 20 and the polycrystalline gallium nitride 154 forms on the silicon dioxide regions 70, 72 and 74. Then, passivation/encapsulation layer 24 is formed on the gallium nitride layer 22. In some embodiments, the polycrystalline gallium nitride 154 in interconnect areas 52 may be removed prior to fabrication of interconnects 40, 42 and 44.

Referring to FIG. 9, devices 30 and 32 are fabricated in device areas 50, and interconnects 40, 42 and 44 are fabricated in interconnect areas 52. The devices 30 and 32 are formed by etching openings in the passivation/encapsulation layer 24 and forming source, gate and drain structures, for example. The interconnects 40, 42, 44 are deposited on the top surface of the passivation/encapsulation layer 24 and are electrically connected to one or more of the devices 30 and 32. The connections to the devices 30 and 32 are not shown and may occur out of the plane of the drawing.

One or more devices, such as for example gallium nitride transistors, may be formed in each device area 50. In addition, one or more interconnects may be formed in each interconnect area 52. The interconnects may be interconnect lines which are used to interconnect devices and/or bond pads, bond pads for bonding of external connection wires, or both. The interconnect lines and bond pads may be fabricated as at least one patterned metal layer. The active devices 30 and 32 and the interconnects 40, 42 and 44 may be fabricated according to known techniques.

Referring to FIG. 10, the silicon substrate 20 is reduced in thickness by thinning of the back side. The GaN on silicon wafers are mounted front side down onto a carrier substrate, which provides a rugged handle to support the active device wafer as the thinning process is performed, using wax or other organic polymers to provide a temporary bond to the carrier wafer. The carrier material can be sapphire, glass, silicon, or silicon carbide. The actual thinning is accomplished by employing typical semiconductor diamond wheel grinding processes to remove the bulk of the unneeded silicon. The grinding of the silicon is then followed by chemical-mechanical polishing utilizing colloidal silica to remove the residual grind damage. The substrate 20 may be reduced in thickness to a final thickness in the range of 50 um to 100 um, but this is not a limitation. After thinning of silicon substrate 20, metal layer 60 is formed on the back surface of the thinned substrate. The metal layer 60 may have a thickness in the range of 1 um to 6 um and may serve as a ground plane for the semiconductor device.

In the completed semiconductor structure 10, each of the interconnects 40, 42 and 44 may be separated from the metal layer 60 in interconnect areas 52 by polycrystalline gallium nitride 154, silicon dioxide regions 70, 72 and 74 and silicon substrate 20. Because the silicon substrate 20 is partially replaced in interconnect areas 52 by silicon dioxide, which has a lower dielectric constant than silicon, the overall dielectric constant of the material between each of interconnects 40, 42 and 44 and metal layer 60 is reduced. The reduction of the dielectric constant in turn reduces the parasitic capacitance between interconnects 40, 42 and 44 and metal layer 60 and thereby improves performance, particularly at high frequencies. It will be understood that the beneficial effect of the silicon dioxide regions 70, 72 and 74 can be increased by increasing the thickness of these regions relative to the total thickness of the silicon substrate 20 and/or by increasing the areas of silicon dioxide regions 70, 72 and 74 which underlie interconnects 40, 42 and 44.

In the embodiments described herein, portions of the silicon substrate 20 which underlie interconnects are replaced with silicon dioxide, which has a lower dielectric constant than silicon. In other embodiments, the silicon in the interconnect areas 52 can be replaced with other materials which have a lower dielectric constant than silicon and which can survive the epitaxial growth temperature of the subsequently-formed III-nitride material, in order to achieve a reduction in parasitic capacitance. In further embodiments, the substrate 20 can be a material other than silicon such as, for example, silicon carbide.

In additional embodiments, the devices in device areas 50 can be any suitable active circuit component and/or passive circuit component, and each device area 50 can include one or more circuit components of the same or different types. In some embodiments, the semiconductor structure includes a single device area 50 and a single interconnect area 52. The number of device areas 50 and the number of interconnect areas 52 are not limitations.

The semiconductor structure has been described as including a III-nitride material layer. In some embodiments, the semiconductor structure includes one or more layers in addition to the III-nitride material layer including but not limited to a diffusion barrier layer, a nucleation layer and/or a buffer layer.

Devices Using the Semiconductor Structures

The semiconductor structures described herein may, according to certain embodiments, form the basis of a variety of semiconductor devices. Suitable devices include, but are not limited to, discrete devices like transistors (e.g., field effect transistors (FETs); either enhancement or depletion mode), Schottky diodes, as well as light-emitting devices including light emitting diodes (LEDs) and laser diodes. Likewise, suitable devices also include integrated circuits (e.g., monolithic microwave integrated circuits (MMICs), combinations of two or more discrete devices, e.g., for assembly of front end modules (FEMs). It may be particularly advantageous, according to certain but not necessarily all embodiments, to use the structures in devices that operate at high frequencies (e.g., at frequencies of 100 MHz or higher for certain power management applications, at frequencies of 1 GHz or higher for certain RF applications. Non-limiting examples of applications using III-nitride devices operating at higher frequencies include power management discretes and integrated circuits used to switch, rectify, monitor, or control electric power from a source to a load (e.g., buck converters, boost converters, half bridges, H-bridges, full bridges, three-phase bridges and multi-phase bridges). Other non-limiting examples of RF applications include discretes and integrated circuits used for transmit and receive functions associated wireless and wireline communications, RF energy, RF plasma lighting, wireless charging, RF induction and microwave heating, RF spark-plugs, ISM, medical devices, RADAR, and electronic warfare and countermeasure devices. In certain embodiments, there may be integrated circuits and/or multiple dice on a chip combining both RF devices and switching devices used to monitor, switch, or control the electric power delivery from a source to a load.

According to certain embodiments, the devices have active regions that are typically, at least in part, formed within the III-nitride material region (e.g., in one or more layers of the III-nitride material device region, such as one or more gallium nitride material layers). According to some embodiments, the devices include a variety of other functional layers and/or features (e.g., electrodes, dielectric regions, field plate layers, etc.).

According to certain embodiments, the semiconductor structure comprises a transistor (e.g., a field effect transistor (FET)). The transistor can comprise, according to certain embodiments, a source electrode and a drain electrode. The source electrode and the drain electrode can be electronically isolated from each other. For example, in some embodiments, the source electrode and the drain electrode are spatially separated by a dielectric material. In some embodiments, the transistor further comprises a gate electrode. The gate electrode may be a Schottky gate or an insulated gate electrode. According to certain embodiments, during use, application of a voltage at the gate electrode can create and/or modify an electric field at least partially positioned between the source electrode and the drain electrode, such that electrons are transferred from the source electrode to the drain electrode. Suitable transistors (e.g., FETs) that may be used in association with certain of the embodiments described herein include depletion mode (normally-ON) transistors and enhancement mode (normally OFF) transistors.

While several embodiments have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present technology. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present technology is/are used. Those skilled in the art will recognize, or be able to ascertain using no more than routine experimentation, many equivalents to the specific embodiments of the technology described herein. It is, therefore, to be understood that the foregoing embodiments are presented by way of example only and that, within the scope of the appended claims and equivalents thereto, the technology may be practiced otherwise than as specifically described and claimed. The present technology is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present technology.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Having described several embodiments of the techniques described herein in detail, various modifications, and improvements will readily occur to those skilled in the art. Such modifications and improvements are intended to be within the spirit and scope of the disclosure. Accordingly, the foregoing description is by way of example only, and is not intended as limiting. The techniques are limited only as defined by the following claims and the equivalents thereto.

The invention claimed is:

1. A semiconductor structure, comprising:
    a substrate;
    a low dielectric constant material region in the substrate, the low dielectric constant material region comprising an oxide and being positioned between a first device area in the semiconductor structure and a second device area in the semiconductor structure, a dielectric constant of the low dielectric constant material region being lower than a dielectric constant of the substrate;
    a III-nitride material layer over the substrate, the III-nitride material layer extending over the substrate in the first device area, over the low dielectric constant material region, and over the substrate in the second device area;
    a first device formed in the III-nitride material layer in the first device area;
    a second device in the III-nitride material layer in the second device area; and
    an interconnect formed over the low dielectric constant material region, the interconnect comprising a metal interconnect line that provides a continuous conductive path of metal from the first device area, over the low dielectric constant material region, and to the second device area.

2. The semiconductor structure according to claim 1, further comprising a metal layer on a back side of the substrate.

3. The semiconductor structure according to claim 1, wherein the low dielectric constant material comprises locally oxidized silicon.

4. The semiconductor structure according to claim 1, wherein the low dielectric constant material comprises silicon dioxide.

5. The semiconductor structure according to claim 1, wherein the first device and the second device comprise transistors.

6. The semiconductor structure according to claim 1, wherein the first device comprises a transistor and the second device comprises a diode.

7. The semiconductor structure according to claim 1, wherein the III-nitride material layer comprises epitaxial gallium nitride.

8. The semiconductor structure according to claim 1, wherein the III-nitride material layer comprises:
    single crystal gallium nitride over the substrate in the first device area and in the second device area; and
    polycrystalline gallium nitride over the substrate in the low dielectric constant material region.

9. The semiconductor structure according to claim 1, wherein the substrate comprises a bulk silicon substrate.

10. The semiconductor structure according to claim 1, wherein the substrate comprises a silicon substrate.

11. The semiconductor structure according to claim 1, wherein the substrate comprises a silicon carbide substrate.

12. The semiconductor structure according to claim 1, further comprising at least one of a diffusion barrier layer, a nucleation layer, or a buffer layer over the substrate in the first device area.

13. The semiconductor structure according to claim 1, wherein a top surface of the low dielectric constant material region is coplanar with a top surface of the substrate.

14. The semiconductor structure according to claim 1, wherein the low dielectric constant material region reduces parasitic capacitance between the interconnect and a layer on a back side of the substrate, as compared to a semiconductor structure in which the low dielectric constant material region is not in the substrate.

15. The semiconductor structure according to claim 1, further comprising:
a metal layer on a back side of the substrate, wherein
the low dielectric constant material region reduces parasitic capacitance between the interconnect and the metal layer, as compared to a semiconductor structure in which the low dielectric constant material region is not in the substrate.

16. A semiconductor structure, comprising:
a substrate;
a low dielectric constant material region in the substrate, the low dielectric constant material region comprising an oxide and being positioned between a first area in the semiconductor structure and a second area in the semiconductor structure, a dielectric constant of the low dielectric constant material region being lower than a dielectric constant of the substrate;
a III-nitride material layer over the substrate, the III-nitride material layer extending over the substrate in the first area, over the low dielectric constant material region, and over the substrate in the second area; and
an interconnect formed over the low dielectric constant material region, the interconnect comprising a metal interconnect line that provides a continuous conductive path of metal from the first area, over the low dielectric constant material region, and to the second area.

17. The semiconductor structure according to claim 16, further comprising:
a first device formed in the III-nitride material layer in the first area; and
a second device in the III-nitride material layer in the second area.

18. The semiconductor structure according to claim 16, wherein a top surface of the low dielectric constant material region is coplanar with a top surface of the substrate.

19. The semiconductor structure according to claim 16, wherein the low dielectric constant material comprises silicon dioxide.

20. The semiconductor structure according to claim 16, wherein the III-nitride material layer comprises:
single crystal gallium nitride over the substrate in the first area and in the second area; and
polycrystalline gallium nitride over the substrate in the low dielectric constant material region.

* * * * *